US011513166B2

(12) United States Patent
Casey et al.

(10) Patent No.: US 11,513,166 B2
(45) Date of Patent: *Nov. 29, 2022

(54) GROUND FAULT DETECTION IN UNGROUNDED POWER SYSTEMS

(71) Applicant: X Development LLC, Mountain View, CA (US)

(72) Inventors: Leo Francis Casey, San Francisco, CA (US); Siyuan Xin, Los Altos, CA (US)

(73) Assignee: X Development LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/373,395

(22) Filed: Jul. 12, 2021

(65) Prior Publication Data

US 2021/0341545 A1 Nov. 4, 2021

Related U.S. Application Data

(63) Continuation of application No. 16/200,863, filed on Nov. 27, 2018, now Pat. No. 11,085,972.

(51) Int. Cl.
*G01R 31/08* (2020.01)
*G01R 31/50* (2020.01)
*G01R 29/08* (2006.01)

(52) U.S. Cl.
CPC .............. *G01R 31/50* (2020.01); *G01R 29/08* (2013.01); *G01R 31/085* (2013.01)

(58) Field of Classification Search
CPC ...... G01R 31/50; G01R 31/52; G01R 31/085; G01R 29/08
See application file for complete search history.

(56) References Cited

U.S. PATENT DOCUMENTS

| 3,662,260 A | 5/1972 | Aubrey et al. |
| 5,202,812 A | 4/1993 | Shinoda et al. |
| 5,764,064 A | 6/1998 | Eriksson et al. |

(Continued)

FOREIGN PATENT DOCUMENTS

| CN | 102540012 | 7/2012 |
| CN | 106353581 | 1/2017 |

(Continued)

OTHER PUBLICATIONS

Ferreira et al., "Faults monitoring System in the Electric Power Grid of Medium Voltage," Procedia Computer Science, Dec. 2018, 130:8 pages.

(Continued)

*Primary Examiner* — Alesa Allgood
(74) *Attorney, Agent, or Firm* — Fish & Richardson P.C.

(57) ABSTRACT

Methods, systems, and apparatus, including computer programs stored on a computer-readable storage medium, for obtaining, from an electric field sensor, measurements of a net electric field resulting from a combination of respective electric fields from two or more electrical power conductors that are proximate to the electric field sensor. The apparatus detects a change in successive measurements of the net electric field. The apparatus determines, based on the change, that an electrical fault has occurred in one of the two or more electric power conductors. The apparatus sends to a server system, data indicating that the electrical fault has occurred in one of the two or more electric power conductors.

20 Claims, 8 Drawing Sheets

(56) References Cited

U.S. PATENT DOCUMENTS

| | | |
|---|---|---|
| 8,581,723 B2 | 11/2013 | Schweitzer, III et al. |
| 9,921,259 B2 | 3/2018 | Tsuchiya et al. |
| 2004/0263149 A1 | 12/2004 | Staats |
| 2005/0135028 A1 | 6/2005 | Kato et al. |
| 2012/0123708 A1 | 5/2012 | Dong et al. |
| 2016/0025785 A1 | 1/2016 | Liu et al. |
| 2017/0059641 A1 | 3/2017 | Louks et al. |

FOREIGN PATENT DOCUMENTS

| | | |
|---|---|---|
| CN | 107918063 | 4/2018 |
| CN | 108181551 | 6/2018 |
| CN | 207882335 | 9/2018 |
| JP | 2007078585 | 3/2007 |
| RU | 2563340 | 9/2015 |

OTHER PUBLICATIONS

Hidaka et al., "Electric Field and Voltage Measurement by using Electro-optic Sensor," Eleventh International Symposium on High Voltage Engineering, Aug. 1999, 14 pages.

PCT International Search Report and Written Opinion in International Appln No. PCT/US2019/063065, dated Jan. 20, 2020, 6 pages.

www.tdworld.com [online] "Short-Circuit and Ground-Fault Detection Device for Overhead Lines," Nov. 16, 2015, retrieved on Nov. 21, 2018, retrieved from URL<https://www.tdworld.com/overhead-distribution/short-circuit-and-ground-fault-detection-device-overhead-lines> 8 pages.

Zhijun et al., "New Ground Fault Protection System for the Field Winding of a Brushless Generator," Electric Machines & Power Systems, May 1997, 25:10 pages.

Office Action in Australian Appln. No. 2019386971, dated Mar. 30, 2022, 3 pages.

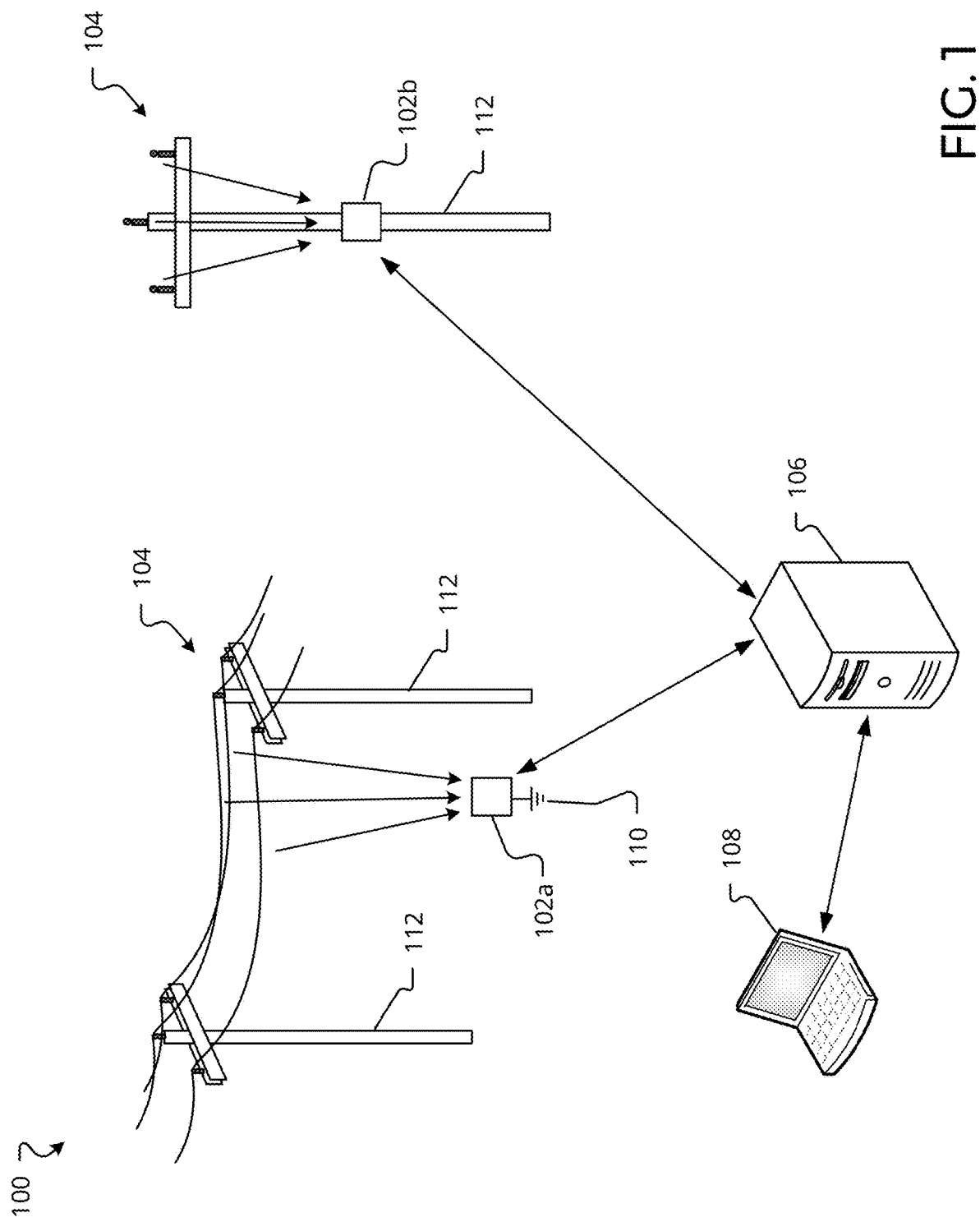

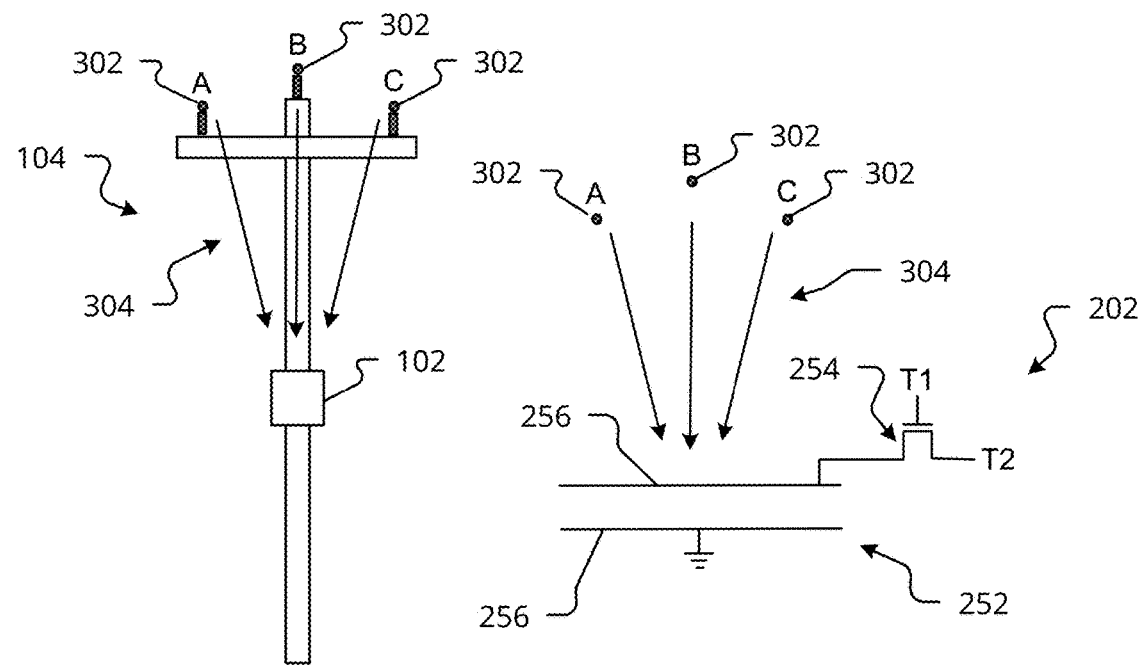
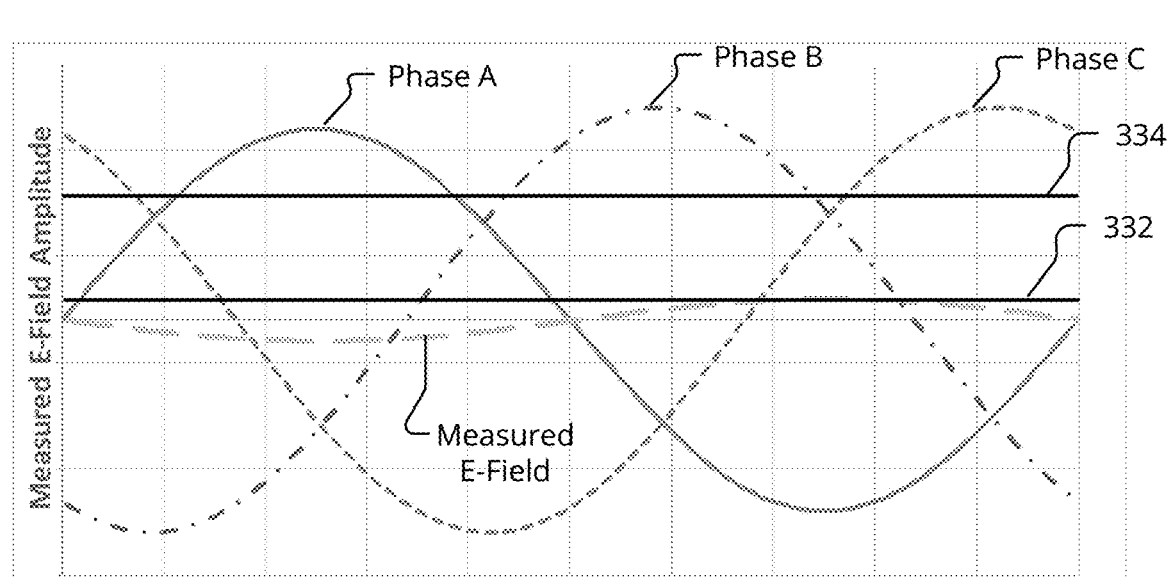
FIG. 3C

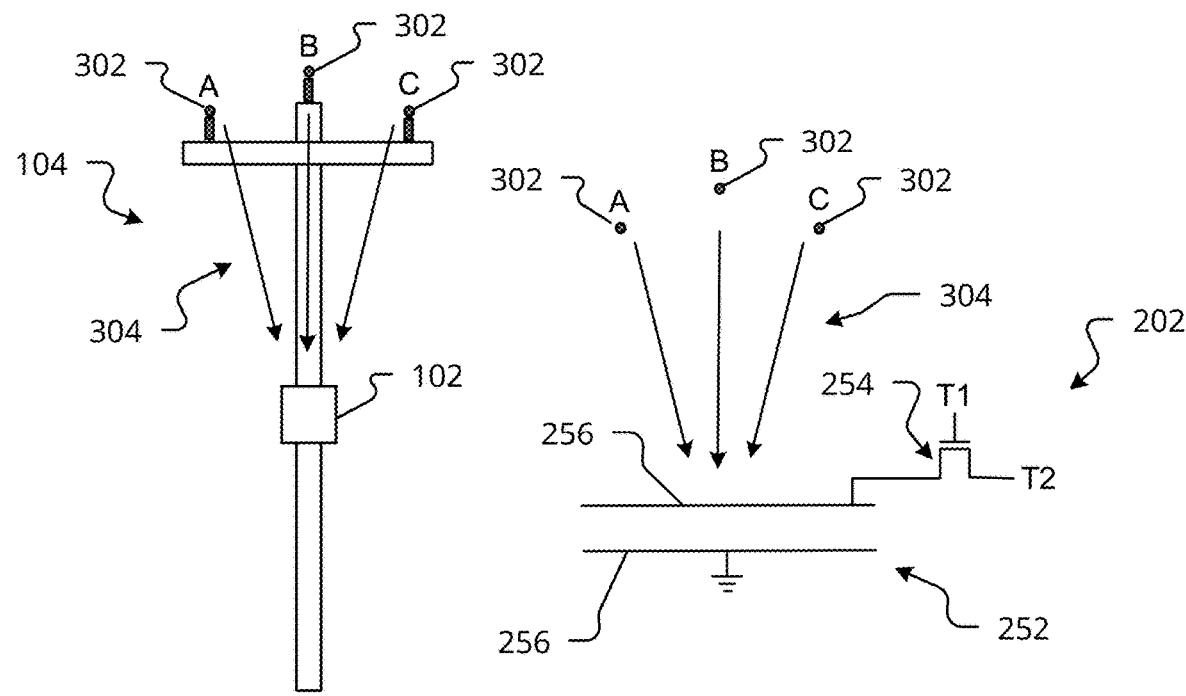
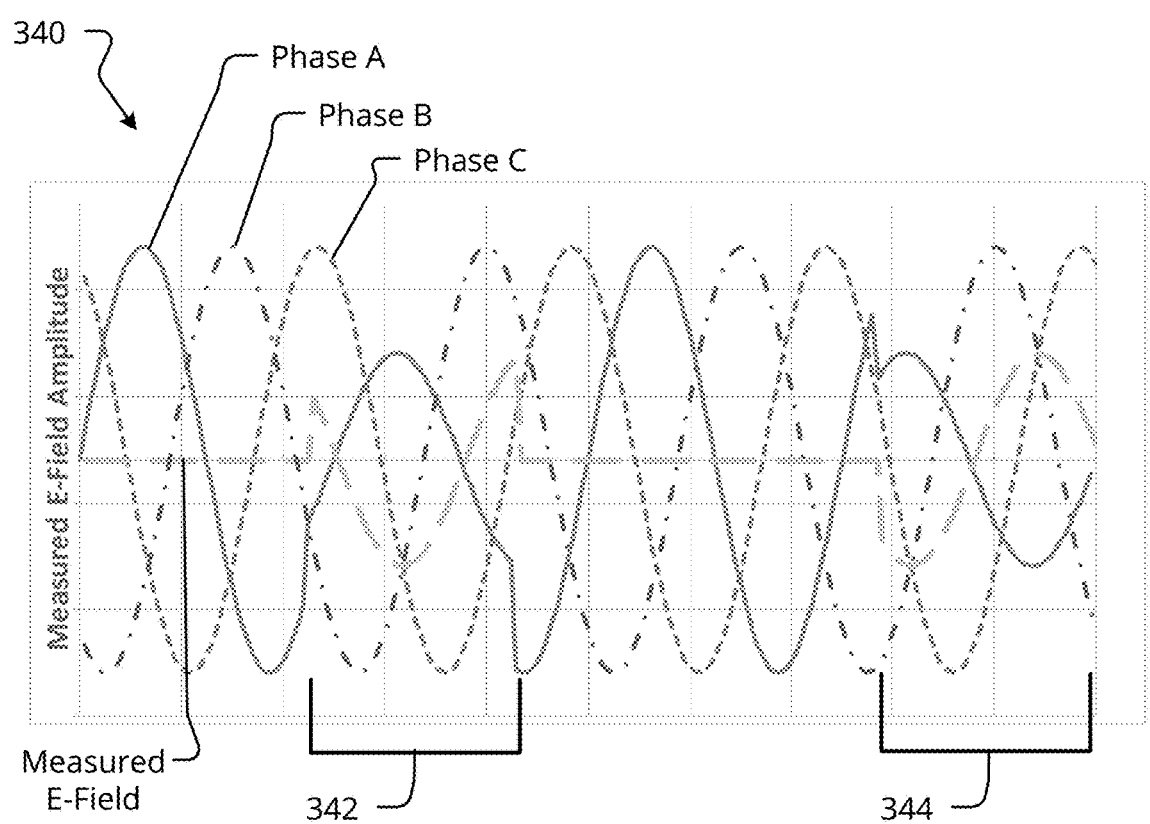
FIG. 3D

GROUND FAULT DETECTION IN UNGROUNDED POWER SYSTEMS

CROSS-REFERENCE TO RELATED APPLICATION

This application is a continuation of U.S. patent application Ser. No. 16/200,863, entitled "GROUND FAULT DETECTION IN UNGROUNDED POWER SYSTEMS", filed Nov. 27, 2018, which is incorporated herein by reference in its entirety.

BACKGROUND

Electrical faults in electrical power systems can cause damage to system components, and, possibly, injury to personnel. Early detection of faults is critical to maintaining the safe operation of such systems. For example, electrical faults such as reduced impedance to ground can create significant increases in the electrical current passing through an electrical power system. In some cases, the increase in the current can be of a sufficient magnitude to cause real and permanent damage to the system and injury to personnel.

SUMMARY

In general, the disclosure relates to detecting electrical faults in electric power transmission systems. More specifically, the disclosure relates to a non-contact ground monitoring device (GMD) and operations of a GMD. A GMD monitors power transmission lines for electrical faults that cause or could potentially cause an electrical ground. An electrical ground in a power transmission system creates the potential for serious damage to the system and injury to humans and animals if the ground is not corrected promptly. A GMD can detect grounds in power transmission lines without making physical contact with the transmission lines.

In general, innovative aspects of the subject matter described in this specification can be embodied in a ground fault detection device that includes an electric field sensor, a power source, and a control system. The control system is coupled to the electric field sensor and the power supply. The control system includes one or more processors and a data store coupled to the one or more processors. The data store has instructions stored thereon which, when executed one or more processors, causes the one or more processors to perform operations that include: receiving an output signal from the electric field sensor, the output signal indicating a value of a net electric field resulting from a combination of respective electric fields from two or more electrical power transmission lines that are proximate to the electric field sensor; detecting, based on a change in the output signal, an electrical fault in one of the two or more electrical power transmission lines; and sending, to a server system, data indicating detection of the electrical fault.

This and other implementations can each optionally include one or more of the following features.

In some implementations, detecting the electrical fault includes determining that a magnitude of the output signal is greater than a magnitude of a previous output signal.

In some implementations, the change in the output signal is a deviation from an approximately zero net electric field measurement.

In some implementations, detecting the electrical fault includes determining that the output signal is greater than a threshold value.

In some implementations, the electric field sensor is one of: a capacitor based electric field sensor, an electro-optical electric field sensor, a Micro-Electro-Mechanical Systems electric field sensor, or an antenna electrode sensor.

In some implementations, the power source includes a battery or a solar cell.

In some implementations, the operations include determining a severity of the electrical fault by comparing the output signal with a plurality of threshold values, each threshold value in the plurality being associated with a respective fault severity level.

In some implementations, the operations include identifying the electrical fault as an intermittent fault. In some implementations, the operations include sending fault characteristics to the server system in response to identifying the electrical fault as an intermittent fault. In some implementations, the fault characteristics include data indicating one or more times at which the electrical fault is detected and one or more times at which the electrical fault is no longer detected. In some implementations, the fault characteristics include data indicating a magnitude of the electrical fault at times when the electrical fault is detected.

In some implementations, identifying the electrical fault as an intermittent fault includes comparing a series of output signals measured over a period of time, and determining that individual output signals in the series of output signals indicate repeated increases and decreases in the net electric field measured by the electric field sensor.

In some implementations, the operations include calibrating the device by: obtaining a series of output signals from the electric field sensor over a period of time, each output signal in the series of output signals indicating a value of a net electric field proximate to the electric field sensor at a respective time during the period of time; determining, from the series of output signal, a baseline net electric field value; and adjusting one or more fault detection thresholds based on the baseline net electric field value.

In some implementations, the data indicating detection of the electrical fault includes location data indicating a geographic location of the device.

In another general aspect, innovative aspects of the subject matter described in this specification can be embodied in methods that include actions of obtaining, from an electric field sensor, measurements of a net electric field resulting from a combination of respective electric fields from two or more electrical power conductors that are proximate to the electric field sensor. Detecting a change in successive measurements of the net electric field. Determining, based on the change, that an electrical fault has occurred in one of the two or more electric power conductors. Sending, to a server system, data indicating that the electrical fault has occurred in one of the two or more electric power conductors. Other implementations of this aspect include corresponding systems, apparatus, and computer programs, configured to perform the actions of the methods, encoded on computer storage devices.

These and other implementations can each optionally include one or more of the following features.

In some implementations, determining that the electrical fault has occurred in one of the two or more electric power conductors includes determining that a magnitude of at least one of the successive measurements is greater than a magnitude of a previous measurement.

In some implementations, the change in the successive measurements of the net electric field is a deviation from an approximately zero net electric field measurement.

In some implementations, determining that the electrical fault has occurred in one of the two or more electric power conductors includes determining that at least one of the successive measurements is greater than a threshold value.

Some implementations include determining a severity of the electrical fault by comparing at least one of the successive measurements with a plurality of threshold values, each threshold value in the plurality being associated with a respective fault severity level.

Among other advantages, implementations may improve the overall safety of electrical power systems, e.g., power transmission and distributions systems. For example, non-contact GMDs can provide early warnings of dangerous conditions in electrical power systems. Implementations provide for less intrusive fault monitoring electrical power systems. For example, non-contact GDMs do not require physical electrical connections to the electrical power systems that they are installed to monitor. Moreover, non-contact GMD systems may provide the ability to monitor for grounds at more locations along a power systems. Accordingly, implementations may provide for more robust and reliable electrical fault monitoring systems.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 1 is a diagram of an exemplary electrical fault detection system 100 according to implementations of the present disclosure.

FIG. 3C is a diagram illustrating exemplary fault detection operations of a GMD 102 for detecting an exemplary fault and determining a severity of the fault according to implementations of the present disclosure.

FIG. 3D is a diagram illustrating exemplary fault detection operations of a GMD for detecting an intermittent fault according to implementations of the present disclosure.

Like reference numbers and designations in the various drawings indicate like elements.

DETAILED DESCRIPTION

Figure 2A:
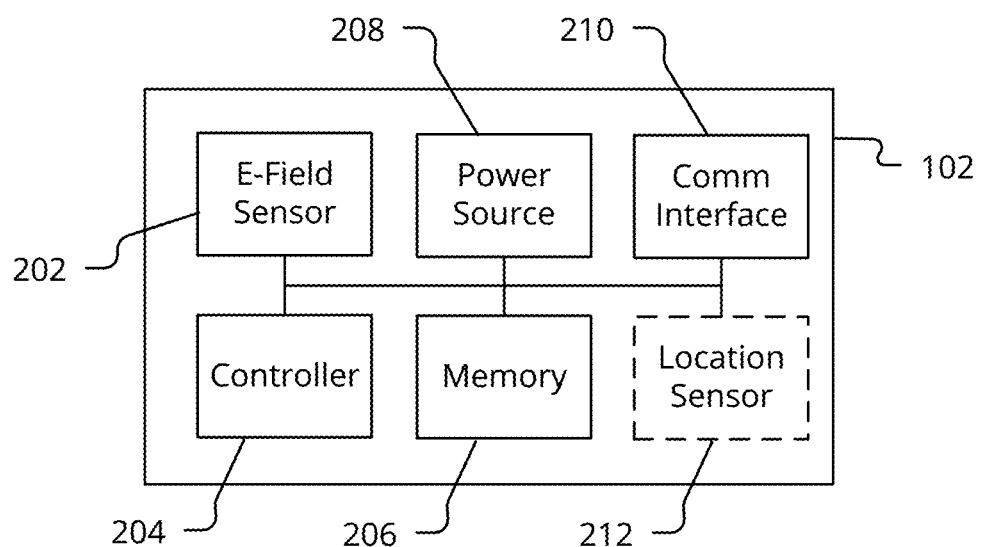
FIG. 2A is a block diagram of an example non-contact ground monitoring device (GMD) according to implementations of the present disclosure.

A fault in an electrical power system (e.g., a ground fault) creates the potential for serious damage to the system and injury to humans and animals if the ground is not corrected promptly. In ungrounded electrical power systems, e.g., ungrounded AC or DC electrical power transmission and distribution systems, one electrical ground will not result in a short circuit. However, if a second electrical ground occurs before the first is corrected a short circuit may occur and create the excessive current which can damage equipment or injure personnel. In other words, early detection of the first electrical ground in ungrounded systems can aid in preventing potentially dangerous situations before a subsequent ground occurs.

More specifically, ungrounded systems have the distinct advantage that the first fault to ground is essentially "free." The electrical power system can keep operating while the first ground is located and corrected. However, a second fault to ground, if of sufficiently low impedance, can cause a ground fault, which can create sufficiently high currents to trip system protection relays and bring the system down until the faults can be located and fixed. Furthermore, excessively high fault currents can cause permanent damage to the conductors, insulators, and/or protection devices in the electric power system. This second fault also has the potential to cause damage to anything in the current carrying path which, in addition to electrical components, can include vegetation such as tree limbs or bushes that can lead to the initiation of fires.

Ground faults are caused by low impedances between current carrying conductors and the ground. For example, low impedances to ground can be caused by dirt/contamination across insulators, encroachment with power lines that lead to contact with vegetation, and damaged conductors or insulators leading to contact with grounded components.

FIG. 1 is a diagram of an exemplary electrical fault detection system 100. The system 100 includes non-contact ground monitoring devices (GMDs) 102a, 102b (collectively 102) in communication with a server system 106, and one or more user computing devices 108. The GMDs 102 are ground detection devices that can detect a ground in an electrical power system by monitoring electric fields generated by an electrical power system. For example, multiple GMDs (e.g., GMD 102a and GMD 102b) are positioned proximate to power transmission lines 104 at various locations in an electrical transmission and distribution (T&D). To be proximate to the power transmission lines 104 a GMD 102 is not in direct contact with the transmission lines 104, but is sufficiently close to the power transmission lines 104 so that electric fields generated by the transmission lines are measurable by an electric field sensor of the GMD's 102. The actual distance between a GMD 102 and the power transmission lines 104 that the GMD 104 is installed to monitor may vary depending on various factors including, but not limited to, the operating voltage of the power transmission lines 104, the sensitivity of a GMD's 102 electric field sensor, and the amount of electrical interference at the location.

The GMDs 102 can be placed so as to establish a network of GMDs 102 for monitoring various portions of the T&D system for electrical faults (e.g., electrical grounds). The GMDs 102 communicate information to the server system 106. For example, each GMD 102a, 102b in a GMD network can communicate information related to the status of electrical faults at their respective locations of the T&D system. The server system 106 analyzes the information received from GMDs 102 in the network and can alert appropriate personnel (e.g., utility maintenance workers) upon one or more of the GMDs 102 detecting a fault condition. For example, the server system 106 can send an appropriate alert to computing devices 108 associated with such personnel.

The server system 106 can include a system of one or more computers. The server system 106 is configured to identify and, in some implementations, locate an electrical fault (e.g., a ground) based on data obtained from a network of GMDs 102. In some implementations, GMDs 102 send data indicating detections of electrical faults to the server system 106 to permit notifications being sent to proper personnel. In some implementations, the server system 106 can use fault detections from a series of GMDs 106 in a network to estimate the location of an electrical fault. For example, the server system 106 can store and execute software to analyze data from a network of GMDs to identify a section of a T&D system in which the fault likely located. In some implementations, the server system 106 can use timing information received from each of a set of GMDs 102 that indicate a fault condition to identify a section of a T&D system in which the fault likely located. For example, when a GMD 102 detects a fault condition, the GMD 102 can send timing data indicating the time of the fault detection. The server system 106 can compare timing information received from several GMDs 102 indicating faults within a similar geographical area to aid with localizing the fault. Furthermore, the server system 106 can provide alerts of detected electrical faults with an estimated location of the fault to appropriate personnel. For example, the server system 106 can store and execute one or more machine learning engines that are programed to estimate a likely location of a detected electrical fault within a T&D system.

User computing devices 108 can be computing devices including, e.g., mobile phones, smart phones, tablet computers, laptop computers, desktop computers, or other portable or stationary computing device. The user computing devices 108 can feature a microphone, keyboard, touch-screen, speaker, or other interfaces that enable users to provide inputs to and receive output from user device 108. For example, the user computing devices 108 can be associated with a utility company or specific utility company personnel. The user computing devices 108 can be configured to receive information from the server system 106 related to fault indication detected by one or more GMDs 102. For example, the user computing devices 108 can include a software application configure to provide associated users with information related to electrical faults detected by a network of GMDs 102.

GMDs 102 can detect grounds in power transmission lines without making physical contact with the power lines 104. A GMD 102 operates by detecting the net electric field generated by a set of power lines 104 (e.g., two lines in a two-phase, or split-phase, system or three lines in a three-phase system). When operating properly (e.g., without an electrical fault), the net electric field of the power lines 104 will be approximately zero. For example, the net electric field may deviate from zero slightly due to normal variations in amplitude and phase of the electrical power being transmitted in the power lines 104 yet still considered to be approximately zero. For instance, variations can occur as electrical power demand changes in the power system. However, if an electrical fault occurs on one of the lines, the electric fields of the individual lines becomes unbalanced causing the net electric field to change, and in some instances to change dramatically and suddenly. The GMD 102 detects the changes in the net electric field and can detect the existence of an electrical fault from the power lines 104 to ground based on such changes.

GMDs 102 can be positioned at various locations to monitor different sections of a T&D system. For example, a GMD 102a can be installed directly on the ground or on a stand between two power line support structures 112. As illustrated in FIG. 1, in some implementations, a GMD 102a is coupled to an electrical ground 110 to, e.g., provide a reference for fault detection. In other implementations, a GMD 102 may not be connected to an electrical ground, but may be electrically floating. In some examples, a GMD 102b can be mounted on a support structure 112. For example, GMD 102b is illustrated as being mounted to a power line 104 support structure 112. A support structure mounted GMD 102b can be coupled to a grounding cable attached to the support structure 112, if desired. For example, ungrounded T&D systems often have a grounding cable for attached to the support structures 112 for purposes other than grounding the power lines 104 themselves. As discussed in more detail below, the GMDs 102b, such as those installed on a support structure 112 may need to establish a baseline electric field measurement from the associated power lines 104 due to interference caused by conductive objects nearby (e.g., a metal support structure). In other words, nearby metal objects may interfere with the individual electric fields generated by each the power lines 104 during normal (un-faulted) operating conditions such that the net electric field deviates from zero. To accommodate, the GMD 102b can be calibrated to establish a baseline "normal" net electric field from the power lines 104 for the area where the GMD 102b is installed.

FIG. 2A is a block diagram of an example non-contact GMD 102. The GMD 102 includes an electric field sensor 202, a controller 204, memory 206, a power source 208, a communication interface 210, and, optionally, a location sensor 212. The power source 208 can be, but is not limited to, a battery (or battery bank), a solar power source, or an A/C power source configured to receive power from the power lines 104. The communication interface 210 is a network interface. For example, the communication interface can be a cellular network interface, a local area network interface (e.g., Wi-Fi interface), a fiber optic interface, or another appropriate networking interface. The location sensor 212 is configured to determine the geographical location of the GMD 102. For example, the location sensor 212 can be a Global Positioning System (GPS) sensor. In some examples, the location sensor 212 is not required. For example, the location of the GMD 102 can be determined using networking based location detection, such as cellular triangulation of Wi-Fi positioning systems.

The electric field sensor 202 is configured to measure the magnitude of an electric field present in the vicinity of the GMD 102. The electric field sensor 202 can be, e.g., a parallel plate capacitor based sensor, an electro-optical electric field sensor, or a MEMS (Micro-Electro-Mechanical Systems) electric field sensor, or an antenna style sensor.

The controller 204 is configured to control the operations of the GMD 102 as described herein. For example, the controller 204 can include one or more processors or microcontrollers configured to execute software instructions stored in the memory 206. The controller 204 is coupled to the electric field sensor. The controller 204 receives output signals from the electric field sensor 202 and processes the signals to determine whether the received signals indicate the existence of an electrical fault, as described in more detail below. In some implementations, the controller 204 controls the operations of the electric field sensor 202. For example, the controller 204 can control operations of the electric field sensor 202 including, but not limited to, the sampling frequency, the sample period, and calibration of the sensor. The controller 204 can also control the operations of the communication interface 210 and the location sensor 212.

Figure 2B:
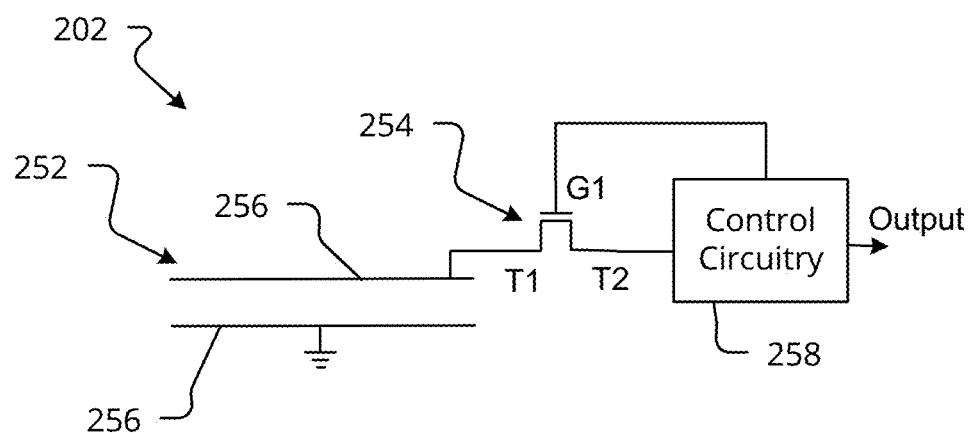
FIG. 2B is a schematic diagram of an example electric field sensor according to implementations of the present disclosure.

FIG. 2B is a schematic diagram of an example electric field sensor 202. FIG. 2B illustrates an example parallel capacitor based electric field sensor 202. The electric field sensor 202 includes a capacitor 252 electrically connected to an electronics switch, e.g., a transistor 256, and sensor control circuitry 258 configured to control the operation of the sensor 202. One of the capacitor 252 electrodes is, optionally, coupled to ground and the other electrode 256 is connected to an input terminal T1 of the transistor 254. The output terminal T2 of the transistor 254 is connected to a measurement input of the sensor control circuitry 258. The control terminal G1 of the transistor is coupled to a control signal output of the sensor control circuitry 258.

The electric field sensor 202 operates by collecting charge on the capacitor 252 from an electric field near the sensor 202. The electric field sensor 202 samples the stored change by turning the transistor 254 on and allowing the capacitor to discharge. The magnitude of the existing electric field is related to the amount of change stored on or discharged by the capacitor 254. Specifically, the magnitude of the measured electric field is proportional to the change density on the capacitor. The sensor control circuitry 258 samples the capacitor 252, e.g., by turning the transistor 254 on, at a frequency sufficient to measure changes in the net electric field. For example, the sensor control circuitry 258 can sample the capacitor 252 at a frequency sufficiently high to avoid aliasing problems with the frequency of the AC power signal being used by a monitored electric power system. The sensor control circuitry 258 measures the amount of change discharged when the capacitor is sampled. In some implementations, the GMD 102 enters a low power or "sleep" mode between samples. Such implementations, will extend the battery life of battery powered GMDs 102.

The sensor control circuitry 258 sends measurement data representing the measured capacitor charge to the controller 204. The measurement data can be, e.g., analog or digital voltage values representing the magnitude of the measured charge. In some implementations, the controller 204 queries the sensor 202 for measurements at time intervals that are different form the sensor's sampling period. For example, the controller 204 can be configured to request measurement data at different intervals depending on different criteria including, but not limited to, whether the GMD 102 has detected an electrical fault, time of day, the state of charge of the GMD's power source 208, or a combination thereof. For example, the controller 204 can be configured to increase the frequency measurement data requests upon the detection of an electrical fault. In some implementations, the electric field sensor 202 (e.g., sensor control circuitry 258) or the controller 204 can evaluate the magnitude of the measured electric field.

Figure 3A:
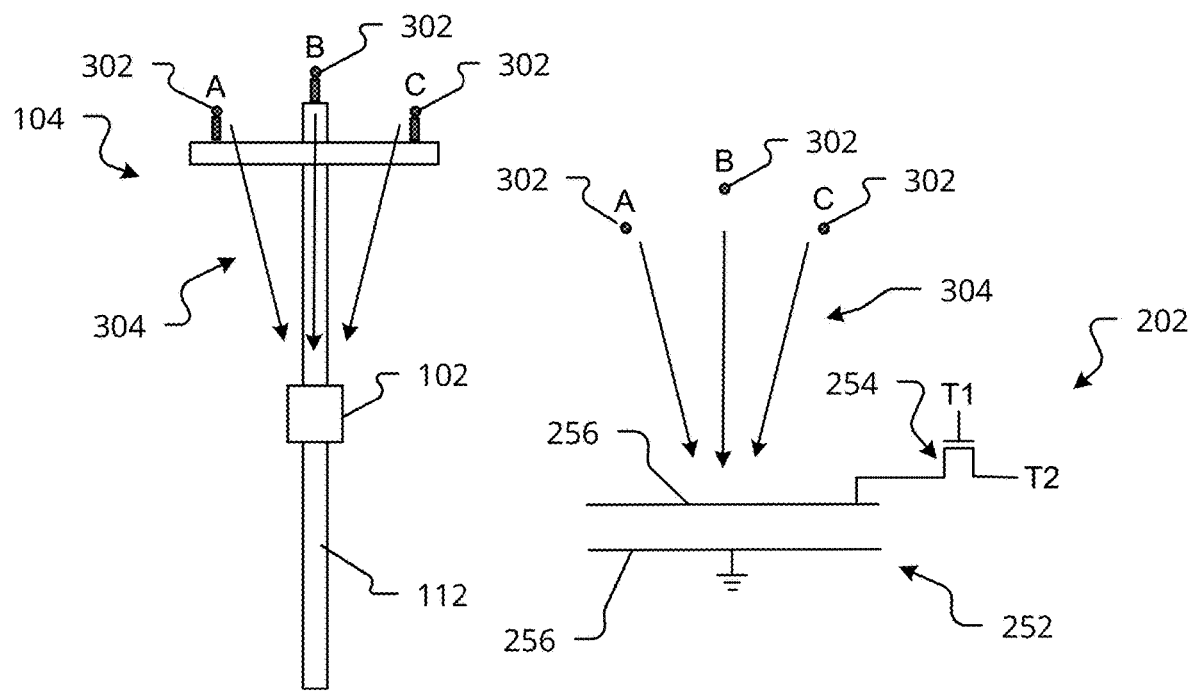
FIG. 3A is a diagram illustrating exemplary normal operating conditions of a GMD according to implementations of the present disclosure.

FIG. 3A is a diagram illustrating exemplary normal operating conditions of a GMD 102. FIG. 3A illustrates the GMD 102 positioned below three conductors 302 of an exemplary 3-phase AC power line 104 system. Each conductor 302 carries one phase of AC current; phase A, phase B, or phase C. Furthermore, the current in each phase is driven by a corresponding alternating voltage with respect to ground. In a three-phase system, for example, the voltage waveform in each phase is 120 degrees out of phase with the others. For example, phase A may have a zero degree phase angle, phase B may have a 120 degree phase angle, and phase C may have a 240 degree phase angle. Each conductor 302 also generates a respective electric field 304 that varies in synchronization voltage with respect to the ground in the phase. So, the electric field generated by the phase B conductor 302 will be 120 degrees out of phase with that generated by the phase A conductor 302.

Graph 310 illustrates the amplitude variations of the respective electric fields generated by the phase A, phase B, and phase C conductors 302. As shown, the voltage potential in the conductors 302, and by extension, the electric fields generated by the voltage are balanced by having equivalent magnitudes and being 120 degrees out of phase with each other, consequently the net electric field measured by the electric field sensor 202 is zero or near zero ("Measured E-field"). That is, the three separate electric fields 304 generated by the changing voltage in the conductors 302 nominally sum to zero during normal operations. Consequently, when the electric field sensor 202 of the GMD 102 measures zero or near zero electric field there is no indication of an electrical fault.

For example, the electric fields 304 of each of the three phases (phases A, B, and C) will tend to cancel each other out, producing a near-zero net electric field at the electric field sensor 202. Therefore, under normal operations, and assuming no external electrical interference with the field from the support structure, the electric field sensor will generally measure a near-zero electric field when sampled. For a capacitor based electric field sensor 202, the capacitor 252 will build up only a minimal amount of change (if any) due to the near-zero net electric field of the electrical power system near the sensor 202. When the GMD 102 samples the electric field sensor 202 only a minimal amount of change will be discharged from the capacitor 252 indicating that a low magnitude net electric field has been measured.

In response to detecting a normal, ungrounded state, the GMD 102 may not transmit any updates to the server system 106. However, in some implementations, the GMD 102 can occasionally transmit data to the server system 106 indicating that no fault conditions have been detected. For example, the GMD 102 may occasionally transmit a negative report (e.g., that no faults have been detected) as a "liveness" signal to indicate to the server system 106 that the GMD 102 is operating properly and that the lack of transmission is not due to a failure of the GMD 102 itself.

Figure 3B:
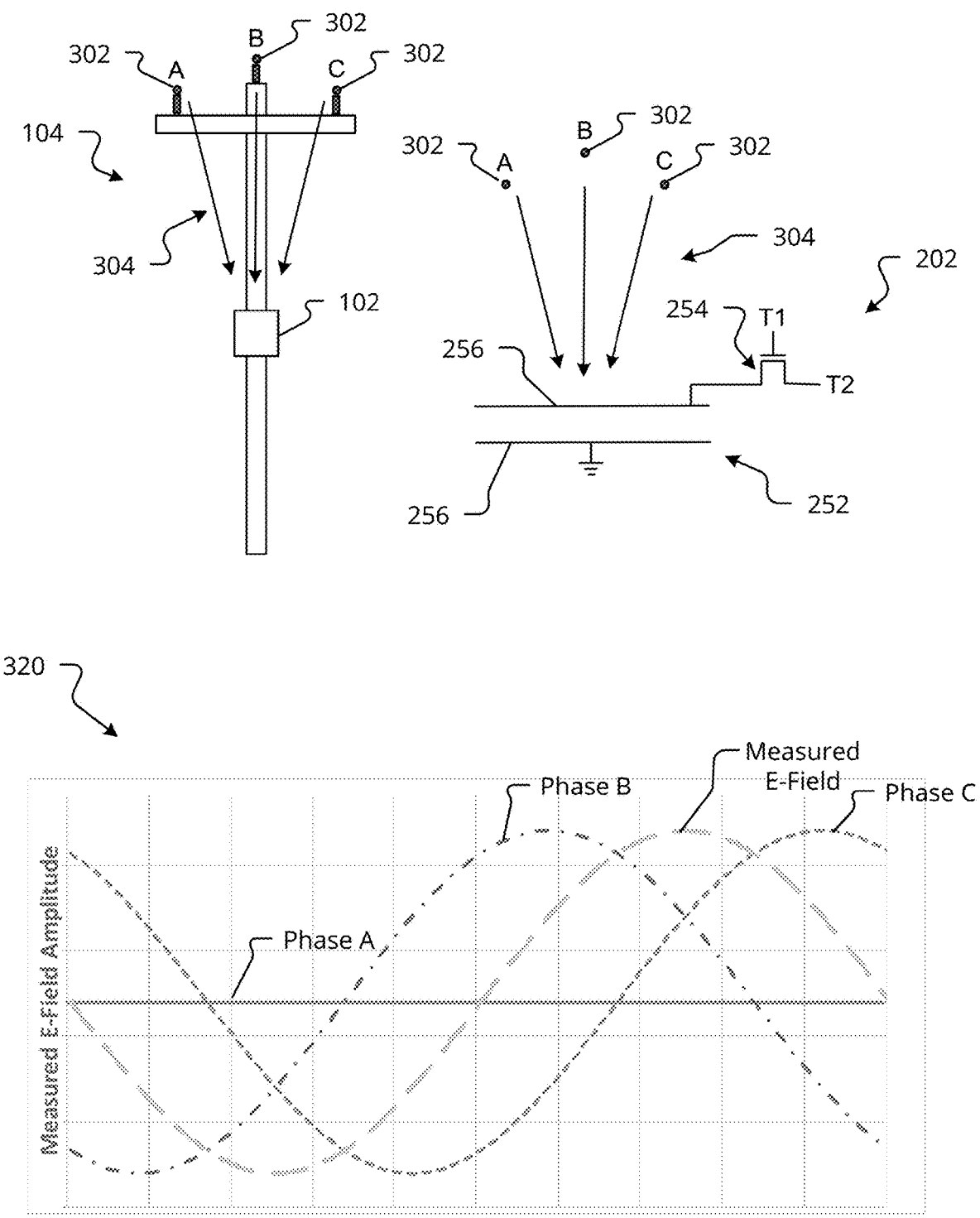
FIG. 3B is a diagram illustrating exemplary fault detection operations of a GMD according to implementations of the present disclosure.

FIG. 3B is a diagram illustrating exemplary fault detection operations of a GMD 102. When one phase of an ungrounded three-phase AC power system becomes grounded by, e.g., experiencing a low impedance to ground, the phases of the power system become unbalanced. For example, graph 320 illustrates phase A as being completely grounded, by having a very low impedance to ground. Thus, the voltage with respect to ground in phase A drops to zero (or near zero). In addition, the corresponding voltage to ground in phases B and C will likely increase. However, when the AC power system becomes unbalanced, the individual electric fields generate by each phase no longer sum to zero at the GMD's 102 electric field sensor 202. Instead, the Measured E-field will deviate from zero in proportion to the significance of the electrical ground. In the example illustrated, the voltage of the phase A conductor 302 has dropped to zero indicating that a short circuit to ground has occurred at some location along the phase a conductor 302. For example, the insulation of the phase A conductor 302 may be damaged and a direct electrical path to ground may have occurred.

In the presence of a significant electrical fault, as illustrated, the electric fields 304 of each of the two unaffected phases (e.g., phases B, and C) will tend to reinforce each other, producing a non-zero net electric field at the electric field sensor 202. The GMD 102 can detect the electrical fault in the power system, by detecting the change in the net electric field. For example, the GMD 102 can detect that the magnitude due to the net electric field measured by the electric field sensor 202 has increased from the previous measurement. In response, the GMD 102 can transmit data to the server system 106 indicating that an electrical fault has likely occurred along a portion of the electrical power system that the GMD 102 is installed to monitor. In some implementations, the GMD 102 can send location data to the server system 106 along with the indication of the detected fault. Location information can include, but is not limited to, GPS data, Wi-Fi positioning data, a serial number of the GMD 102, or a combination thereof. As discussed below, the server system 106 can use the location data of the GMD 102 to aid in identifying possible locations of the electrical fault along the conductors 302.

For example, a capacitor based electric field sensor 202 will measure the increased net electric field by building up a significant amount of charge due to the increased magnitude of the net electric field if the power system becomes unbalanced. When the GMD 102 samples the electric field sensor 202 an amount of charge that is proportional to the increased magnitude of the net electric field near the sensor 202 will be discharged from the capacitor 252, thus, indicating the increase in the magnitude of the net electric field.

The GMD 102 can detect the increase in the magnitude of the net electric field given off by the power system by, for example, comparing the subsequent electric field measurements to previous electric field measurements and detecting the increase in the net electric field. In some implementations, the GMD 102 can detect the increase in the magnitude of the net electric field given off by the power system by comparing electric field measurements to one or more threshold values. For example, the GMD 102 can store a table of threshold net electric field measurement values each indicative of a different severity level of an electrical fault. In some implementations, the GMD 102 compares subsequent electric field measurements to prior measurements as a first order check to identify a change in the magnitude of the measured net electric field, and, upon detecting an increase, compares the measured electric field value to one or more threshold values to determine a potential severity of a corresponding electrical fault.

FIG. 3C is a diagram illustrating exemplary fault detection operations of a GMD 102 for detecting an exemplary fault and determining a severity of the fault. Graph 330 illustrates a potentially minor electrical fault. For example, the electric field generated by phase A of the electric power system is slightly reduced, for example, due to a slightly reduced impedance to ground along the phase A conductor 302. However, even the slight reduction in the magnitude of the electric field generated from the phase A conductor 302 causes a minor imbalance in the net electric field measured by the electric field sensor 202. As illustrated, the magnitude of the Measured E-Field increases slightly. As noted above, the GMD 102 can detect this increase in the Measured E-Field, by, for example, comparing the present Measured E-Field value with a previous electric field measurement to detect the increase. In a similar manner, the GMD 102 can detect that an electrical fault has been corrected by comparing the present Measured E-Field value with a previous electric field measurement to detect a decrease in the magnitude net electric field.

Graph 330 also illustrates example fault detection threshold values 332, 334 for determining the potential severity of an electrical fault. As indicated above, the magnitude of the net electric field measured by the GMD 102 can serve as an indication of the severity of a potential electrical fault. For example, an electrical ground is generally more severe with a lower electrical impedance between a conductor 302 and ground. This relative reduction in impedance to ground created by an electrical fault may manifest itself in the amount of decrease in the voltage to ground of the affected phase. The GMD 102 can measure the severity based on the amount by which the net electric field increases due to the reduction in the voltage to ground of the affected phase.

For example, a measured net electric field that meets or exceeds the first threshold value 332 may indicate a minor electrical fault. A minor electrical fault may be one that should be corrected, but does not require urgent attention because the impedance to ground is still sufficient to prevent excessive current surges if a second ground were to occur. By contrast, a measured net electric field that meets or exceeds the second threshold value 334 may indicate a major electrical fault. A major electrical fault may be one which should be corrected immediately to prevent potentially damaging current surges if a second ground were to occur before the detected fault is corrected.

In some implementations, the GMD 102 can send fault characteristic data to the server system 106 when reporting fault indications. For example, fault characteristic data can include, but is not limited to, data indicating the severity of potential faults. In some implementations, the GMD 102 can send the actual electric field measurement data to the server system 106. The server system 106 can use the electric field measurement data to determine the severity of the potential faults by, e.g., using a similar process of comparing to fault detection threshold values.

In some implementations, the threshold fault detection values may provide a mechanism for avoiding excessive false positive fault detections. For example, the measured electric field may deviate from a near-zero value due to an external electrical interference such as an object passing between the conductors 302 and the GMD 102. However, deviations due to external interference may not be sufficient to cause measured net electric field to exceed the first threshold value 332. Accordingly, the use of threshold values to aid in detecting significant changes in the net electric field can provide an allowance for some level of deviation in the net electric field measurements without causing the GMD 102 to generate unnecessary fault detection notifications.

In some implementations, the GMD 102 can calibrate the fault detection threshold values. For example, the GMD 102 can calibrate the fault detection threshold values to account for effects of external factors on the net electric field near a location at which the GMD 102 is installed. For example, GMDs 102 installed on support structures 112 may experience interference from metal contained in the support structures 112 or from other nearby metal objects. For example, nearby metal objects may interfere with the electric fields generated by each phase of the electric power system and cause the net electric field to appear unbalanced. As another example, electric fields the GMD 102 may be positioned at a location below the power line conductors 302 (or to the side if the power lines are configured vertically) where the electric fields are slightly asymmetric such as being off set to one side or positioned at a too close the field of the closest wire will be dominant. In such situations, the "normal" net electric field measured by a GMD 102 under non-fault conditions may be greater than that measured by a GMD 102 in locations that do not contain such interfering objects or by a GMD 102 positioned in a location where the electric fields are substantially symmetric. In some implementations, a GMD 102 can calibrate fault detection threshold values for its particular location by adjusting the fault detection threshold values based on measurements of the net electric field under known non-fault conditions over a period of time. For example, a GMD 102 can average a series of measurements performed over a calibration period to establish a baseline net electric field measurement for non-fault conditions. The fault detection threshold values for that particular GMD 102 can then be increased based on an established baseline net electric field value. For example, the fault detection threshold values can be increased by the established baseline net electric field value, or by an appropriate factor of the baseline value.

FIG. 3D is a diagram illustrating exemplary fault detection operations of a GMD 102 for detecting an intermittent fault. Graph 340 illustrates an example of electric field measurements from an electric field sensor 202 if the power supply system experiences an intermittent fault. For example, an intermittent ground fault can be caused by intermittent contact between one of the conductors 302 (e.g., the phase A conductor 302) with a low impedance path to ground. For instance, during high winds one of the conductors 302 may intermittently come in contact with an object (e.g., a damp tree branch) creating a conductive path to ground. Such intermittent contact can cause the magnitude of the voltage in the affected conductor 302 to decrease, and, by extension, cause the magnitude of the electric field generated by the conductor to decrease. Consequently, the electric field sensor 202 will measure intermittent increases in the magnitude of the net electric field (e.g., as shown during times 342 and 344). Such measurements may appear to the GMD 102 as if a fault is being repetitively detected and cleared.

In some implementations, a GMD 102 can detect an intermittent fault by comparing a series of net electric field measurements over a period of time to identify indications of repeated increases and decreases in the net electric field measurements. In some implementations, the GMD 102 records characteristics of the intermittent fault including, but not limited to, the magnitude of the net electric field when the fault is detected, changes in the magnitude of the net electric field, times at which the fault detections occur, times at which the fault clears, or a combination thereof. In some implementations, the GMD 102 sends the characteristics of the intermittent fault to the server system 106. In some implementations, the GMD 102 or the server system 106 can use the characteristics of the intermittent fault to identify potential causes of the fault. For example, the GMD 102 or the server system 106 can correlate the characteristics of the intermittent fault with known fault characteristic to identify a potential cause of the fault.

In some implementations, the server system 106 can obtain weather data for a region near a section of the electrical power system that is monitored by a GMD 102 that detected the intermittent fault. The server system 106 can use the weather data in combination with the intermittent fault data from the GMD 102 to identify a potential cause of the intermittent fault. For example, the server system 106 can correlate the weather data with the characteristics of the intermittent fault to identify a potential cause of the fault. For example, if the weather data indicates strong winds in the region, the server system can send an alert to utility personnel indicating that there is likely an environmentally caused fault (e.g., a tree branch) creating an intermittent ground connection in the monitored section of the power system. However, if the weather data does not indicate strong winds the server system 106 may identify a different cause of the intermittent fault.

Figure 4:
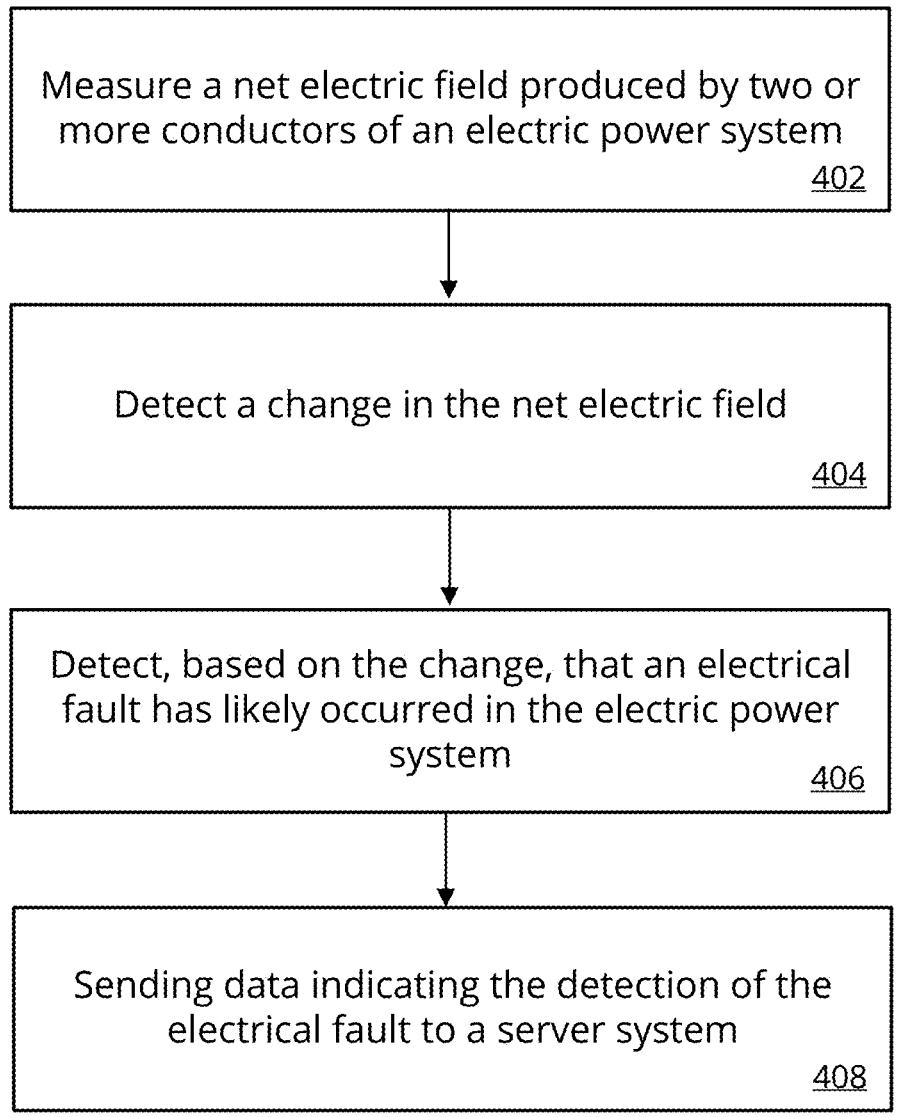
FIG. 4 is a flow diagram that illustrates example processes for detecting electrical faults in electrical power systems according to implementations of the present disclosure.

FIG. 4 is a flow diagram that illustrate a process 400 for detecting electrical faults in electrical power systems. The process 400 can be performed by one or more computing devices. For example, as discussed above, the process 400 may be performed by the GMD 102 of FIG. 1.

The GMD measures a net electric field produced by two or more conductors of an electric power system (402). For example, the GMD can obtain measurements from an electric field sensor of the net electric field present proximate to the sensor. For example, the GMD can obtain output signals from an electric field sensor that indicate the magnitude of the net electric field proximate to the sensor. For example, the net electric field proximate to the electric field sensor is the net electric field that is measurable by the sensor. Put differently, the net electric field proximate to the sensor is the electric field present near the sensor that creates measurable changes in the electric field sensor. In some implementations, the GMD queries the electric field sensor for measurements at a time interval. For example, the GMD can be configured to query the electric field sensor for measurements at a periodic or an aperiodic time interval. In some implementations, the GMD can vary the time interval in response to different criteria. For example, the GMD can increase the frequency at which it queries the electric field sensor in response to detecting an electrical fault.

The GMD detects a change in the net electric field (404). For example, the GMD can compare successive measurements from the electric field sensor to detect changes in the measured net electric field. The GMD can detect a ground fault based on detected changes in the measured electric field (406). For example, the GMD can determine based on the change in the electric field that an electrical fault has likely occurred in one of the two or more conductors. The GMD can determine that an electrical fault has occurred by comparing a subsequent electric field measurement to a previous measurement. For example, the subsequent electric field measurement may indicate an electrical fault if the magnitude of the subsequent measurement is greater than that of the previous measurement. For example, if the magnitude of the electric field measurement increases by a predetermined threshold value, the GMD can determine that a fault has likely occurred. In some implementations, the GMD can confirm the existence of a fault by comparing the subsequent electric field measurement with one or more fault severity threshold values. In some implementations, the GMD can determine the severity of the potential fault by comparing the subsequent electric field measurement with one or more fault severity threshold values. For example, more severe faults may be indicated by higher magnitude net electric field measurements.

The GMD sends data indicating the detection of the electrical fault to a server system (408). For example, the server system can be a central server system configured to monitor for electrical faults from a network of GMDs. The GMD can send the fault detection data to the server system to enable the server system to provide appropriate alerts regarding the electrical fault to computing devices associated with utility personnel who are responsible for maintaining the operations of the electric power system. The fault detection data can include, but is not limited to, an indication that a fault has been detected, location information associated with the GMD, characteristics of the fault detection, or a combination thereof. Characteristics of the fault detection can include, but are not limited to, electric field measurement data indicative of the fault, times at which the measurements were taken, a severity level of the fault, times at which the fault clears (e.g., for an intermittent fault), or a combination thereof.

In some implementations, the GMD can identify the electrical fault as an intermittent fault. For example, the GMD can compare a series of electric field measurements obtained over a period of time. The GMD can determine that individual measurements in the series of measurements indicate repeated increases and decreases in the net electric field measured by the electric field sensor that are indicative of repeated fault detections and subsequent clearing of the faults. For example, the measurements may repeatedly exceed and then fall below a fault detection threshold value.

In some implementations, the GMD can be configured to calibrate its fault detection thresholds to account for the environment at the location in which it is installed. For example, the GMD can obtain a series of electric field sensor measurements over a period of time (e.g., a calibration period), where each measurement in the series of measurements indicates a value of the net electric field proximate to the sensor at a respective time during the period of time. The GMD can determine a baseline net electric field value for the location based on the series of measurements. For example, the GMD can average the measurements in the series. The GMD can calibrate the fault detection thresholds by adjusting one or more of threshold values based on the baseline net electric field value, or based on a factor thereof.

Although the operations of a GMD have been generally described in reference to detecting electrical faults in a three-phase AC electrical power system, the GMD 102 can be configured for use with other ungrounded electrical power systems as well. For example, GMDs can be configured for use with ungrounded DC systems and other ungrounded AC systems, e.g., ungrounded single phase or two-phase AC power systems.

Figure 5:
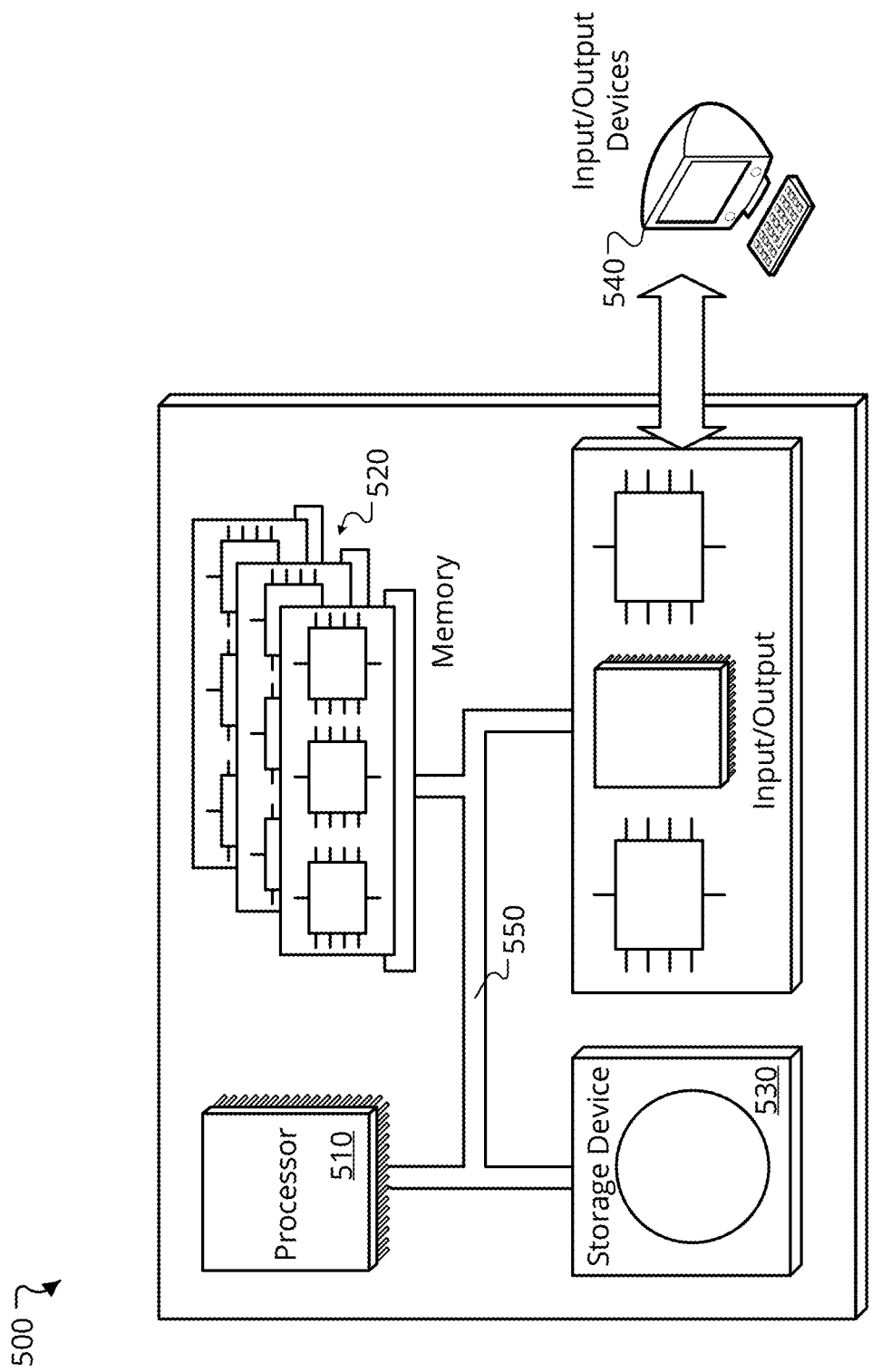
FIG. 5 depicts a schematic diagram of a computer system that may be applied to any of the computer-implemented methods and other techniques described herein.

FIG. 5 is a schematic diagram of a computer system 500. For example, the system, or portions thereof, can be implemented as the GMD controller or the server system described above in reference to FIGS. 1 and 2A. The system 500 can be used to carry out the operations described in association with any of the computer-implemented methods described previously, according to some implementations. In some implementations, computing systems and devices and the functional operations described in this specification can be implemented in digital electronic circuitry, in tangibly-embodied computer software or firmware, in computer hardware, including the structures disclosed in this specification (e.g., system 500) and their structural equivalents, or in combinations of one or more of them. The system 500 is intended to include various forms of digital computers, such as laptops, desktops, workstations, personal digital assistants, servers, blade servers, mainframes, and other appropriate computers, including vehicles installed on base units or pod units of modular vehicles. The system 500 can also include mobile devices, such as personal digital assistants, cellular telephones, smartphones, and other similar computing devices. Additionally, the system can include portable storage media, such as, Universal Serial Bus (USB) flash drives. For example, the USB flash drives may store operating systems and other applications. The USB flash drives can include input/output components, such as a wireless transducer or USB connector that may be inserted into a USB port of another computing device.

The system 500 includes a processor 510, a memory 520, a storage device 530, and an input/output device 540. Each of the components 510, 520, 530, and 540 are interconnected using a system bus 550. The processor 510 is capable of processing instructions for execution within the system 500. The processor may be designed using any of a number of architectures. For example, the processor 510 may be a CISC (Complex Instruction Set Computers) processor, a RISC (Reduced Instruction Set Computer) processor, or a MISC (Minimal Instruction Set Computer) processor.

In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

The computer system can include clients and servers. A client and server are generally remote from each other and typically interact through a network, such as the described one. The relationship of client and server arises by virtue of computer programs running on the respective computers and having a client-server relationship to each other.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The invention claimed is:

1. A ground fault detection device comprising:
   an electric field sensor;
   a power source; and
   a control system coupled to the electric field sensor and the power source, the control system comprising one or more processors and a data store coupled to the one or more processors having instructions stored thereon which, when executed by the one or more processors, causes the one or more processors to perform operations comprising:
   obtaining output signals from the electric field sensor at measurement intervals, the output signals indicating respective values of a net electric field resulting from a combination of respective electric fields from two or more electrical power transmission lines that are proximate to the electric field sensor;
   detecting, based on a change in at least one of the output signals, an electrical fault in at least one of the two or more electrical power transmission lines, wherein detecting the electrical fault comprises determining that a magnitude of the at least one of the output signals is greater than a magnitude of a previous output signal; and
   sending, at intervals to a server system, fault characteristic data indicating one or more times at which measurements are taken that indicate the electrical fault is detected and one or more times at which measurements are taken that indicate the electrical fault has cleared.

2. The device of claim 1, wherein the change in at least one of the output signals is a deviation from an approximately zero net electric field measurement.

3. The device of claim 1, wherein detecting the electrical fault comprises determining that the magnitude of the at least one of the output signals is greater than a threshold value.

4. The device of claim 1, wherein the electric field sensor is selected from the group consisting of: a capacitor based electric field sensor, an electro-optical electric field sensor, a Micro-Electro-Mechanical Systems electric field sensor, or an antenna electrode sensor.

5. The device of claim 1, wherein the power source includes a battery or a solar cell.

6. The device of claim 1, wherein the operations further comprise determining a severity of the electrical fault by comparing the magnitude of the at least one of the output signals with a plurality of threshold values, each threshold value in the plurality being associated with a respective fault severity level.

7. The device of claim 1, wherein the fault characteristics include data indicating a magnitude of the electrical fault at times when the electrical fault is detected.

8. The device of claim 1, wherein the operations further comprise calibrating the device by:
   obtaining a series of output signals from the electric field sensor over a period of time, each output signal in the series of output signals indicating a value of a net electric field proximate to the electric field sensor at a respective time during the period of time;

determining, from the series of output signal, a baseline net electric field value; and adjusting one or more fault detection thresholds based on the baseline net electric field value.

9. The device of claim 1, wherein the data indicating detection of the electrical fault includes location data indicating a geographic location of the device.

10. The device of claim 1 further comprising a switch electrically connected between the electric field sensor and an input to the control system, wherein the electric field sensor comprises a capacitor, and wherein the operations further comprise:

turning the switch on, at a measurement interval, such that charge stored on the capacitor is measured and the capacitor is discharged;

turning the switch off after the measurement interval; and entering a low power mode.

11. The device of claim 1, wherein the operations further comprise identifying the electrical fault as an intermittent fault.

12. The device of claim 11, wherein identifying the electrical fault as an intermittent fault comprises:

comparing a series of output signals measured over a period of time; and determining that individual output signals in the series of output signals indicate repeated increases and decreases in the net electric field measured by the electric field sensor.

13. A computer-implemented electrical fault detection method comprising:

obtaining output signals from an electric field sensor at measurement intervals, the output signals indicating respective values of a net electric field resulting from a combination of respective electric fields from two or more electrical power transmission lines that are proximate to the electric field sensor;

detecting, based on a change in at least one of the output signals, an electrical fault in at least one of the two or more electrical power transmission lines, wherein detecting the electrical fault comprises determining that a magnitude of the at least one of the output signals is greater than a magnitude of a previous output signal; and sending, at intervals to a server system, fault characteristic data indicating one or more times at which measurements are taken that indicate the electrical fault is detected and one or more times at which measurements are taken that indicate the electrical fault has cleared.

14. The method of claim 13, wherein the change in the successive measurements of the net electric field is a deviation from an approximately zero net electric field measurement.

15. The method of claim 13, wherein detecting the electrical fault comprises determining that at least one of the successive measurements is greater than a threshold value.

16. The method of claim 13 further comprising determining a severity of the electrical fault by comparing at least one of the successive measurements with a plurality of threshold values, each threshold value in the plurality being associated with a respective fault severity level.

17. The method of claim 13 further comprising estimating a location of the electrical fault within an electric system based on the fault characteristic data from the electric field sensor and second fault characteristic data from a second electric field sensor.

18. The method of claim 17, wherein estimating the location comprises comparing first timing data included in the fault characteristic data with second timing data included in the second fault characteristic data.

19. A non-transitory computer readable medium storing instructions that, when executed by at least one processor, cause the at least one processor to perform operations comprising:

obtaining output signals from an electric field sensor at measurement intervals, the output signals indicating respective values of a net electric field resulting from a combination of respective electric fields from two or more electrical power transmission lines that are proximate to the electric field sensor;

detecting, based on a change in at least one of the output signals, an electrical fault in at least one of the two or more electrical power transmission lines, wherein detecting the electrical fault comprises determining that a magnitude of the at least one of the output signals is greater than a magnitude of a previous output signal; and sending, at intervals to a server system, fault characteristic data indicating one or more times at which measurements are taken that indicate the electrical fault is detected and one or more times at which measurements are taken that indicate the electrical fault has cleared.

20. The medium of claim 19, wherein the change in the successive measurements of the net electric field is a deviation from an approximately zero net electric field measurement.

* * * * *